| (12) | United States Patent<br>Shiba et al. | (10) Patent No.: US 10,897,830 B2<br>(45) Date of Patent: Jan. 19, 2021 |
|---|---|---|

(54) POWER CONTROL UNIT AND POWER CONTROL UNIT MOUNTING STRUCTURE

(71) Applicant: Toyota Jidosha Kabushiki Kaisha, Toyota (JP)

(72) Inventors: Kenjiro Shiba, Takahama (JP); Keisuke Yuki, Toyota (JP); Takuya Yashiki, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 159 days.

(21) Appl. No.: 16/296,745

(22) Filed: Mar. 8, 2019

(65) Prior Publication Data

US 2019/0281723 A1 Sep. 12, 2019

(30) Foreign Application Priority Data

Mar. 12, 2018 (JP) .................................. 2018-044539

(51) Int. Cl.
| *H05K 7/14* | (2006.01) |
| *H05K 5/02* | (2006.01) |
| *B60L 15/00* | (2006.01) |
| *B60R 11/00* | (2006.01) |
| *H05K 5/00* | (2006.01) |

(52) U.S. Cl.
CPC .......... *H05K 7/1432* (2013.01); *B60L 15/007* (2013.01); *B60R 11/00* (2013.01); *H05K 5/0013* (2013.01); *H05K 5/0204* (2013.01); *B60R 2011/0052* (2013.01)

(58) Field of Classification Search
None
See application file for complete search history.

(56) References Cited

U.S. PATENT DOCUMENTS

| 6,628,523 | B2 * | 9/2003 | Kobayashi | ........... | H05K 5/0047 |
| | | | | | 361/736 |
| 9,666,504 | B2 * | 5/2017 | Abeyasekera | ........ | H01L 23/473 |
| 9,688,228 | B2 * | 6/2017 | Azuma | ................ | H05K 5/0204 |
| 2008/0158823 | A1 * | 7/2008 | Tominaga | ............ | H05K 5/0043 |
| | | | | | 361/709 |

(Continued)

FOREIGN PATENT DOCUMENTS

| JP | 2013021855 A | 1/2013 |
| JP | 2015205597 A | 11/2015 |

(Continued)

*Primary Examiner* — Courtney L Smith
(74) *Attorney, Agent, or Firm* — Dinsmore & Shohl LLP

(57) ABSTRACT

A power control unit is located inside a housing chamber of a driving unit of a vehicle, and the power control unit includes a casing housing a power conversion device. The casing includes casing segments, and fastening parts are located around the casing segments. The casing segments are fastened to each other with bolts at the fastening parts, and the fastening parts include a specific fastening part on which a shear load concentrates when a load is input into the casing, and an ordinary fastening part other than the specific fastening part. The specific fastening part has an induction portion inducing plastic deformation, which is configured to lower an elastic limit of the specific fastening part when the load is input into the casing, such that the specific fastening part undergoes plastic deformation earlier than the ordinary fastening part.

9 Claims, 9 Drawing Sheets

(56) References Cited

U.S. PATENT DOCUMENTS

| | | | |
|---|---|---|---|
| 2010/0253188 A1* | 10/2010 | Koyama | H05K 5/0073 312/223.1 |
| 2013/0250521 A1* | 9/2013 | Kawai | H05K 5/0082 361/714 |
| 2013/0314966 A1 | 11/2013 | Sasayama | |
| 2015/0305177 A1 | 10/2015 | Nakashima | |
| 2016/0128215 A1* | 5/2016 | Kanzaki | H05K 5/0082 361/752 |
| 2016/0295734 A1 | 10/2016 | Ueda | |

FOREIGN PATENT DOCUMENTS

| | | |
|---|---|---|
| JP | 2016049862 A | 4/2016 |
| JP | 2016192493 A | 11/2016 |
| JP | 2017165254 A | 9/2017 |
| WO | 2012108036 A1 | 8/2012 |

\* cited by examiner

POWER CONTROL UNIT AND POWER CONTROL UNIT MOUNTING STRUCTURE

CROSS-REFERENCE TO RELATED APPLICATIONS

This application claims priority to Japanese Patent Application No. 2018-044539 filed on Mar. 12, 2018, which is incorporated herein by reference in its entirety including the specification, drawings and abstract.

BACKGROUND

1. Technical Field

The present disclosure relates to a power control unit and a power control unit mounting structure.

2. Description of Related Art

A structure for fixing an inverter to a vehicle body at fixing parts disposed on both sides in a vehicle width direction is known (Japanese Patent Application Publication No. 2016-49862). In this structure, the strength with which the inverter is fixed to the vehicle body is differentiated between the fixing parts on one side and the fixing parts on the other side in the vehicle width direction, so as to cause the inverter to shift in an intended direction during a collision of the vehicle.

SUMMARY

In the case of a power control unit including a casing that is composed of a plurality of casing segments fastened together with bolts, if the strength with which the casing is fixed to the vehicle body is enhanced so as to suppress a shift of the casing during a collision of the vehicle, the collision load borne by fastening parts of the casing segments increases. As a result, bolts at the fastening parts may fracture and the casing may break. On the other hand, if fastening parts at which the casing is fixed to the vehicle body are made strong, bolts at these fastening parts on the vehicle body side may fracture and a mounting part on the vehicle body side may break.

The present disclosure provides a power control unit that can suppress fracture of a bolt at a fastening part of the casing and thereby increase the load-carrying capacity of the casing. Further, the present disclosure provides a power control unit mounting structure that can suppress fracture of a bolt at a fastening part at which the casing is fastened to a vehicle body, and can thereby increase the load-carrying capacity of a mounting structure on the vehicle body side.

A first aspect of the disclosure relates to an power control unit being equipped with a casing housing a power converter, the casing being disposed inside a housing chamber of a driving unit of a vehicle. The casing includes a plurality of casing segments. A plurality of fastening parts are located around the plurality of casing segments. The plurality of casing segments are fastened to each other with bolts at the plurality of fastening parts. The plurality of fastening parts include a specific fastening part on which a shear load concentrates when a load is input into the casing, and an ordinary fastening part other than the specific fastening part. The specific fastening part has an induction portion inducing plastic deformation. The induction portion is configured to lower an elastic limit of the specific fastening part when the load is input into the casing, such that the specific fastening part undergoes plastic deformation earlier than the ordinary fastening part.

In the first aspect, each of the plurality of fastening parts may have a bolt insertion hole and an internal thread, and a bolt among the bolts may be inserted through the bolt insertion hole, and the internal thread may mesh with the bolt inserted through the bolt insertion hole. In the specific fastening part, a part that the bolt and the internal thread mesh with each other is a first engagement allowance of the bolt; in the ordinary fastening part, a part that the bolt and the internal thread mesh with each other is a second engagement allowance of the bolt. In the induction portion, a length of the first engagement allowance of the bolt may be shorter than a length of the second engagement allowance of the bolt.

In the first aspect, each of the plurality of fastening parts may have a bolt seating surface on which a head of the bolt is seated. In the specific fastening part, a distance from the bolt seating surface to a position at which the internal thread and the bolt inserted through the bolt insertion hole start to mesh with each other is a first insertion distance; in the ordinary fastening part, a distance from the bolt seating surface to a position at which the internal thread and the bolt inserted through the bolt insertion hole start to mesh with each other is a second insertion distance. In the induction portion, the first insertion distance may be longer than the second insertion distance.

In the first aspect, the induction portion may have a bolt thinner than a bolt of the ordinary fastening part.

In the first aspect, each of the plurality of fastening parts may have a bolt insertion hole and an internal thread, and a bolt among the bolts may be inserted through the bolt insertion hole, and the internal thread may mesh with the bolt inserted through the bolt insertion hole. In a range from a joint surface of the plurality of casing segments to a position at which the internal thread and the bolt inserted through the bolt insertion hole start to mesh with each other in the specific fastening part, the inducing portion may have such a space that the bolt and the casing segment are not in contact with each other.

A second aspect of the disclosure relates to a mounting structure of a power control unit, the power control unit being equipped with a casing housing a power converter, the casing being disposed inside a housing chamber of a driving unit of a vehicle. The casing is fastened with bolts at a plurality of fastening parts to a predetermined member provided in the housing chamber of the driving unit. The plurality of fastening parts include a specific fastening part on which a shear load concentrates when a load is input into the casing, and an ordinary fastening part other than the specific fastening part. The specific fastening part has an induction portion inducing plastic deformation. The induction portion is configured to lower an elastic limit of the specific fastening part when the load is input into the casing, such that the specific fastening part undergoes plastic deformation earlier than the ordinary fastening part.

In the second aspect, each of the plurality of fastening parts may have a bolt insertion hole and an internal thread, and a bolt among the bolts may be inserted through the bolt insertion hole, and the internal thread may mesh with the bolt inserted through the bolt insertion hole. In the specific fastening part, a part that the bolt and the internal thread mesh with each other is a first engagement allowance of the bolt; in the ordinary fastening part, a part that the bolt and the internal thread mesh with each other is a second engagement allowance of the bolt. In the induction portion, a length of the first engagement allowance of the bolt may be shorter than a length of the second engagement allowance of the bolt.

In the second aspect, each of the plurality of fastening parts may have a bolt seating surface on which a head of the bolt is seated. In the specific fastening part, a distance from the bolt seating surface to a position at which the internal thread and the bolt inserted through the bolt insertion hole start to mesh with each other is a first insertion distance; in the ordinary fastening part, a distance from the bolt seating surface to a position at which the internal thread and the bolt inserted through the bolt insertion hole start to mesh with each other is a second insertion distance. In the induction portion, the first insertion distance may be longer than the second insertion distance.

A third aspect of the disclosure relates to an power control unit being equipped with a casing housing a power converter, the casing being disposed inside a housing chamber of a driving unit of a vehicle. The casing includes a plurality of casing segments. A plurality of fastening parts are located around the plurality of casing segments. The plurality of casing segments are fastened to each other with bolts at the plurality of fastening parts. The plurality of fastening parts include a specific fastening part on which a shear load concentrates when a load is input into the casing, and an ordinary fastening part other than the specific fastening part. The specific fastening part has an induction portion inducing plastic deformation. An elastic limit of the specific fastening part is lower than an elastic limit of the ordinary fastening part, such that the specific fastening part undergoes plastic deformation earlier than the ordinary fastening part when the load is input into the casing.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

First Embodiment

Figure 1:
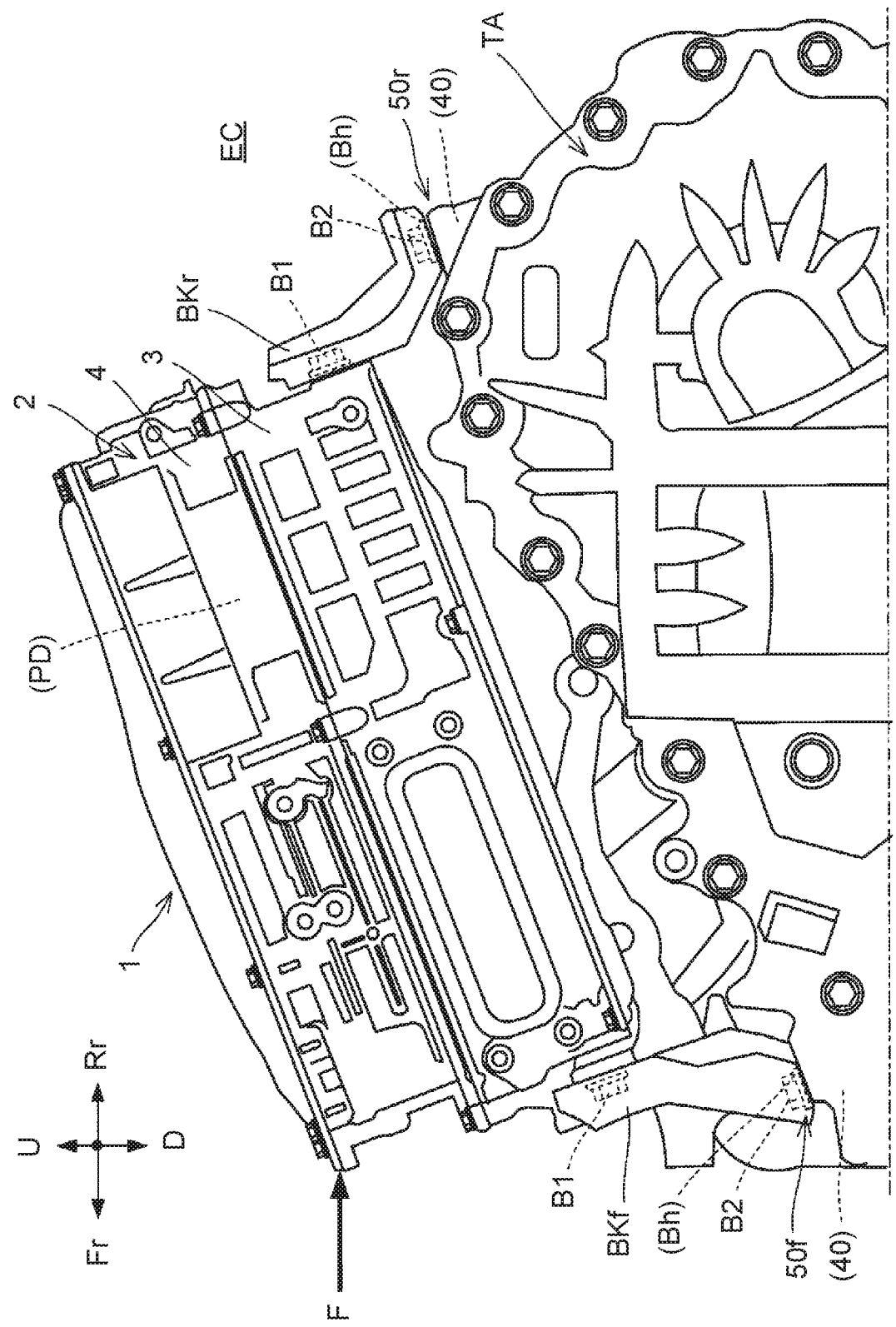
FIG. 1 is a view showing a state where a power control unit is mounted.
Figure 2:
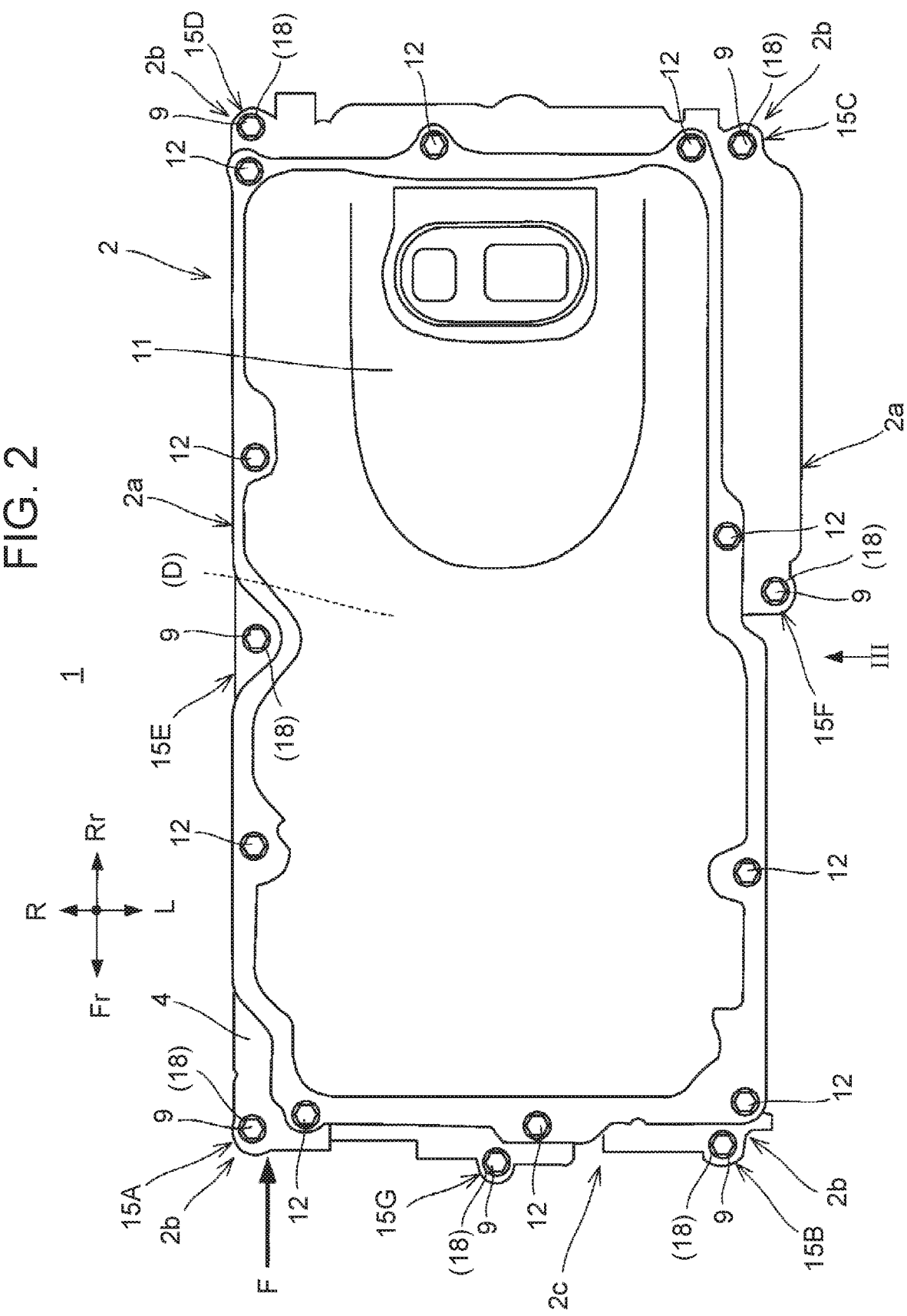
FIG. 2 is a top view of the power control unit of FIG. 1.
Figure 3:
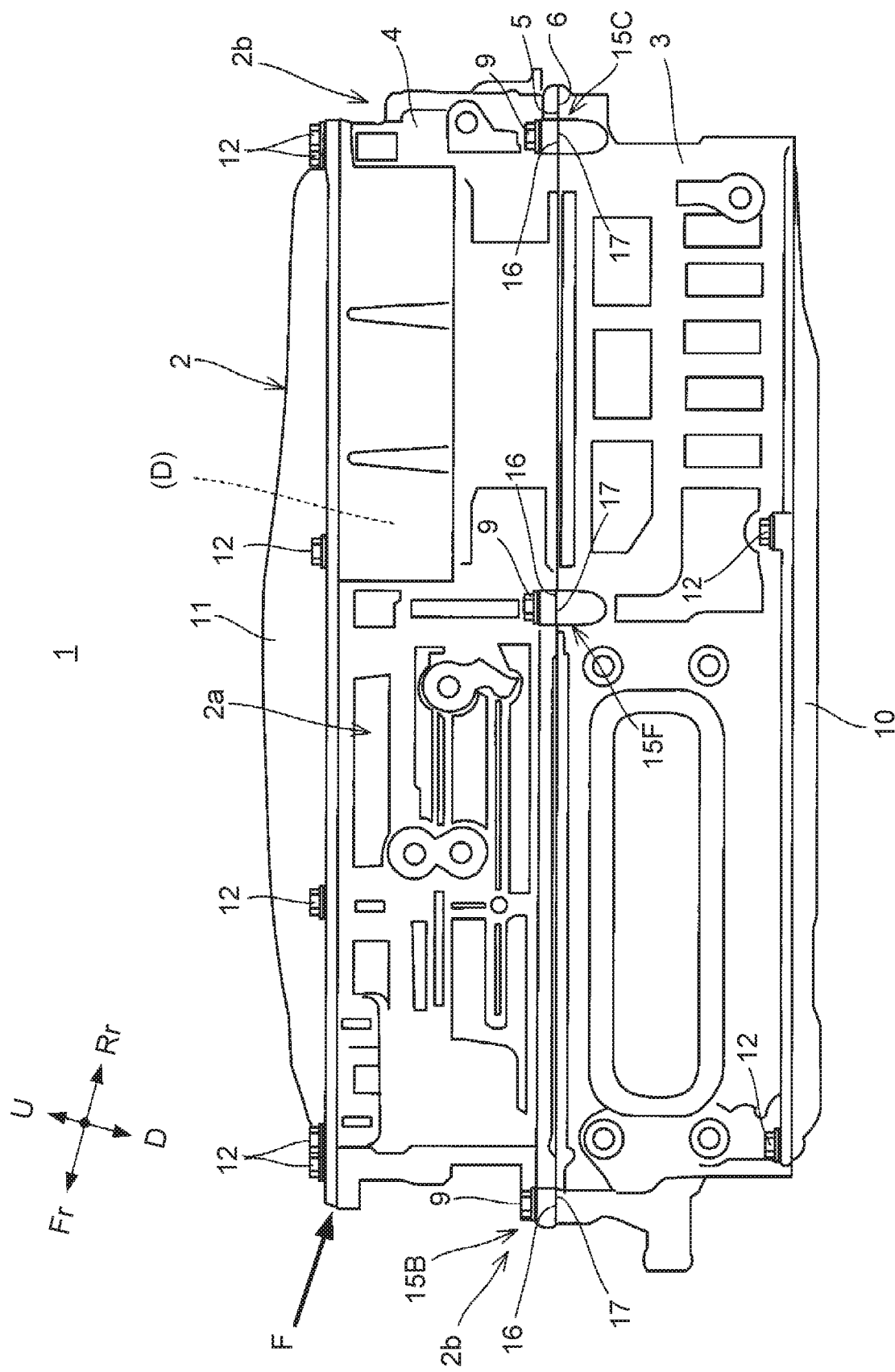
FIG. 3 is a view showing a state as seen from the direction of arrow III in FIG. 2.

A power control unit (hereinafter referred to as a PCU) 1 shown in FIG. 1 to FIG. 3 is used, for example, to control electricity in a vehicle, such as a hybrid electric vehicle or an electric vehicle. The PCU 1 is disposed inside an engine compartment EC in which a driving source of the vehicle, such as an internal combustion engine, is installed. The engine compartment EC is disposed on a vehicle front side, and the engine compartment EC corresponds to an example of the driving unit housing chamber according to the above-described aspect. The PCU 1 includes a casing 2 having a roughly rectangular shape and housing a power converter PD that functions, for example, as an inverter and a converter. In FIG. 1 and other drawings, arrows Fr, Rr, R, L, U, and D indicate the vehicle front side, a vehicle rear side, a vehicle right side, a vehicle left side, a vehicle upper side, and a vehicle lower side, respectively.

As shown in FIG. 1, the casing 2 of the PCU 1 is mounted, with the vehicle front side thereof inclined downward, on an upper part of a transaxle TA that is an example of a predetermined member provided inside the engine compartment EC. The transaxle TA is fixed to a vehicle body constituent member, such as a side member (not shown). The casing 2 is mounted on the upper part of the transaxle TA through two brackets BKf, BKr that are disposed respectively on the vehicle front side and the vehicle rear side of the casing 2. The brackets BKf, BKr are fastened to the casing 2 with a plurality of bolts B1 arrayed in a vehicle width direction, and are fastened to the transaxle TA with a plurality of bolts B2 arrayed in the vehicle width direction. Fastening parts 50f . . . and fastening parts 50r . . . against which the brackets BKf, BKr are respectively pressed and in that state fastened with the bolts B2 are provided on the upper part of the transaxle TA. The bolts B2 are inserted through bolt insertion holes Bh formed in the brackets BKf, BKr and in that state screwed into internal threads 40 formed in the transaxle TA.

As shown in FIG. 2, the casing 2 has a roughly rectangular shape, and has a pair of side surfaces 2a extending in a vehicle front-rear direction and four corners 2b located at both ends of the side surfaces 2a. As shown in FIG. 3, the casing 2 includes a converter case 3 that is located on the lower side in a vehicle-height direction and houses a converter circuit, and an inverter case 4 that is located on the upper side in the vehicle-height direction and houses an inverter circuit. The terms converter circuit, inverter circuit, converter case, and inverter case are terms that are used merely for the convenience of referring to different components, and it is not intended to make clear distinctions among these components based on differences in function or structure. The converter case 3 and the inverter case 4 correspond to an example of the casing segments according to the above-described aspect. The converter case 3 and the inverter case 4 are each open on both sides in the vehicle-height direction. The converter case 3 and the inverter case 4 are placed one on top of the other in the vehicle-height direction, with a joint surface 5 extending around an upper opening of the converter case 3 and a joint surface 6 extending around a lower opening of the inverter case 4 butted together. As shown in FIG. 2, the casing 2 is formed as the converter case 3 and the inverter case 4 are fastened together with bolts 9 at seven fastening parts 15A to 15G provided around the converter case 3 and the inverter case 4. As shown in FIG. 3, a lower opening of the converter case 3 is closed by a lower cover 10, and an upper opening of the inverter case 4 is closed by an upper cover 11. The lower cover 10 and the upper cover 11 are fastened together with a plurality of bolts 12.

To secure electromagnetic shielding of the casing 2, each component of the casing 2 is made of a metal material. The converter case 3 and the inverter case 4 are formed by casting an aluminum material, and the lower cover 10 and the upper cover 11 are formed by performing press-working on a steel sheet material. However, the lower cover 10 and the upper cover 11 may be made of, for example, an aluminum material instead of a steel sheet material. To secure sealing of the casing 2, each component of the casing 2 is joined with a foamed-in-place gasket (FIPG), which is a type of liquid sealing material, applied to a joint surface. Unless otherwise noted, bolts used for the fastening parts are made of a steel material.

Figure 4:
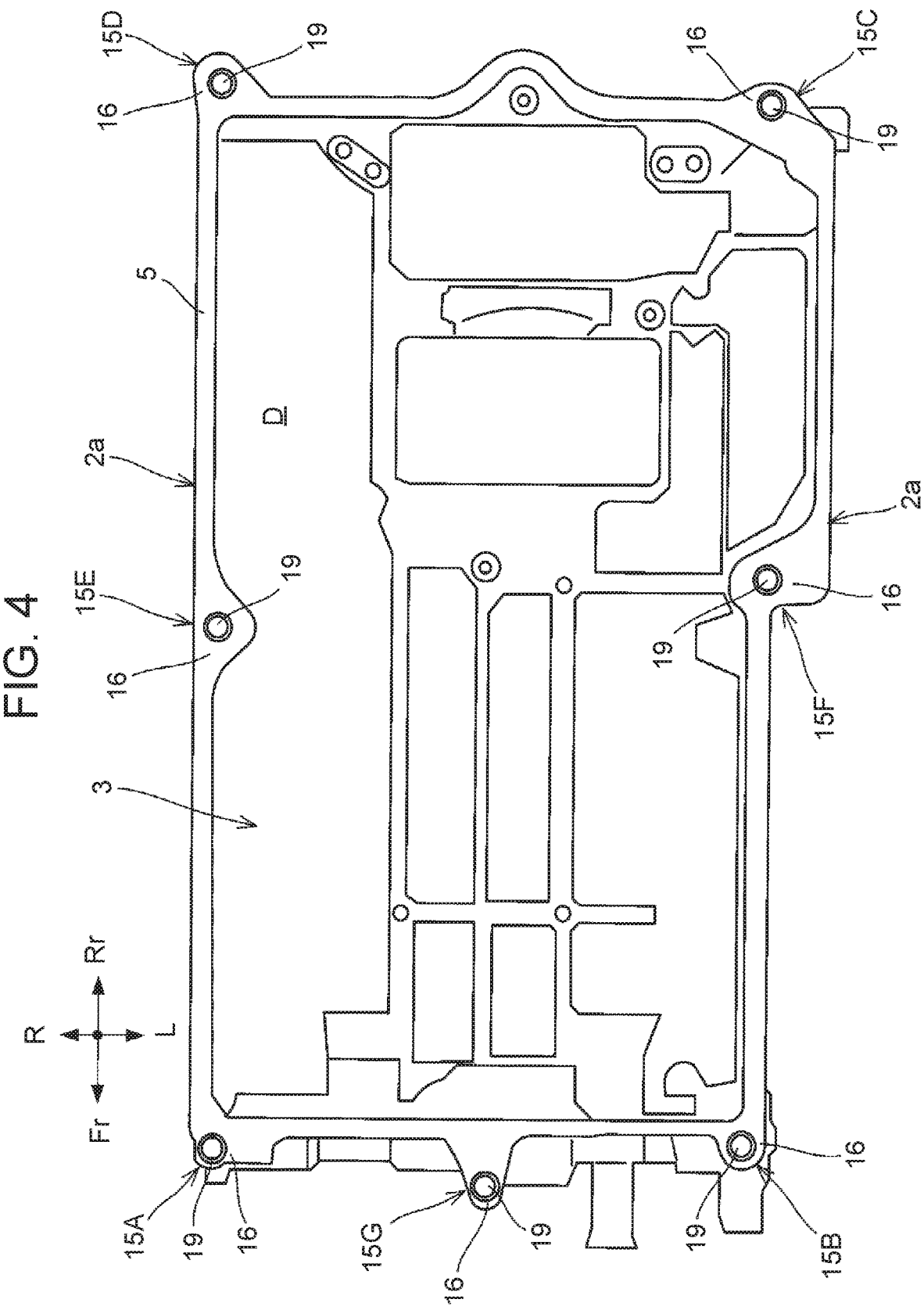
FIG. 4 is a top view showing a state of a lower segment of a casing of FIG. 2 that is divided into upper and lower segments.

The fastening parts 15A to 15G of the casing 2 to be fastened with the bolts 9 are disposed in the casing 2, respectively on the corners 2b, the side surfaces 2a, and a front surface 2c on the vehicle front side. Hereinafter, the fastening parts 15A to 15G may be referred to as fastening parts 15 when no distinction among these fastening parts is required. Each fastening part 15 is formed as a fastening surface 16 integral with the joint surface 5 of the converter case 3 and a fastening surface 17 integral with the joint surface 6 of the inverter case 4 are placed one on top of the other. While FIG. 4 shows the arrangement of the joint surface 5 and the fastening surfaces 16 of the converter case 3, the arrangement of the joint surface 6 and the fastening surfaces 17 of the inverter case 4 is similar to the arrangement shown in FIG. 4.

Of the fastening part 15E and the fastening part 15F disposed on the side surfaces 2a of the casing 2, the vehicle right-side fastening part 15E is disposed in the middle between the fastening part 15A and the fastening part 15D, and the vehicle left-side fastening part 15F is disposed in the middle between the fastening part 15B and the fastening part 15C. In each fastening part 15, a bolt insertion hole 18 (see FIG. 2) through which the bolt 9 is inserted is formed on the side of the inverter case 4, and an internal thread 19 (see FIG. 4) that meshes with the bolt 9 is formed on the side of the converter case 3.

In the event of a frontal collision of the vehicle, as shown in FIG. 1 to FIG. 3, a collision load F due to the frontal collision is input into a vehicle front right-side part of the inverter case 4 of the casing 2 of the PCU 1. The collision load F corresponds to an example of the load according to the above-described aspect. The input position and direction of the collision load F are determined by a positional relationship between the PCU 1 and peripheral devices, such as various members and devices, provided inside the engine compartment EC. When the collision load F is input into the inverter case 4 of the casing 2, a shear load acts on the bolts 9 provided at the fastening parts 15.

Figure 5:
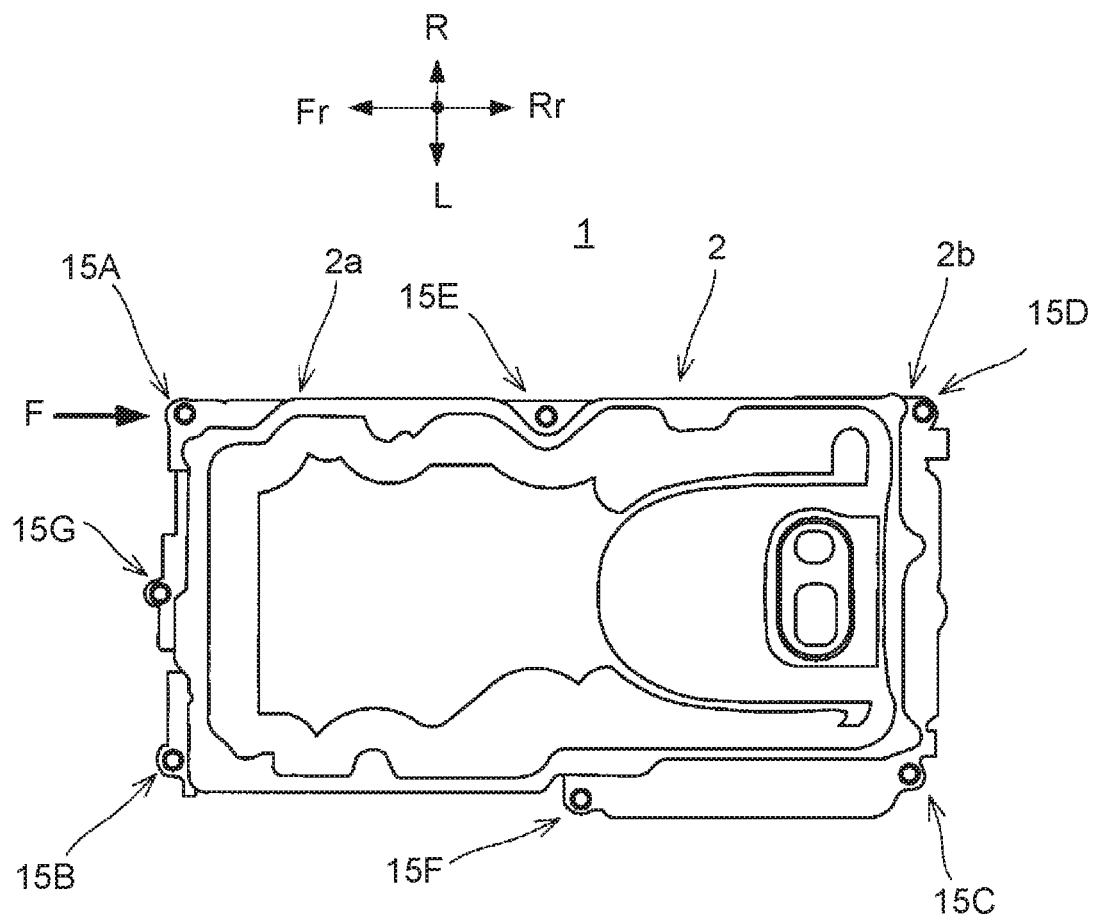
FIG. 5 is a view schematically showing a collision load and a plurality of fastening parts.
Figure 6A:
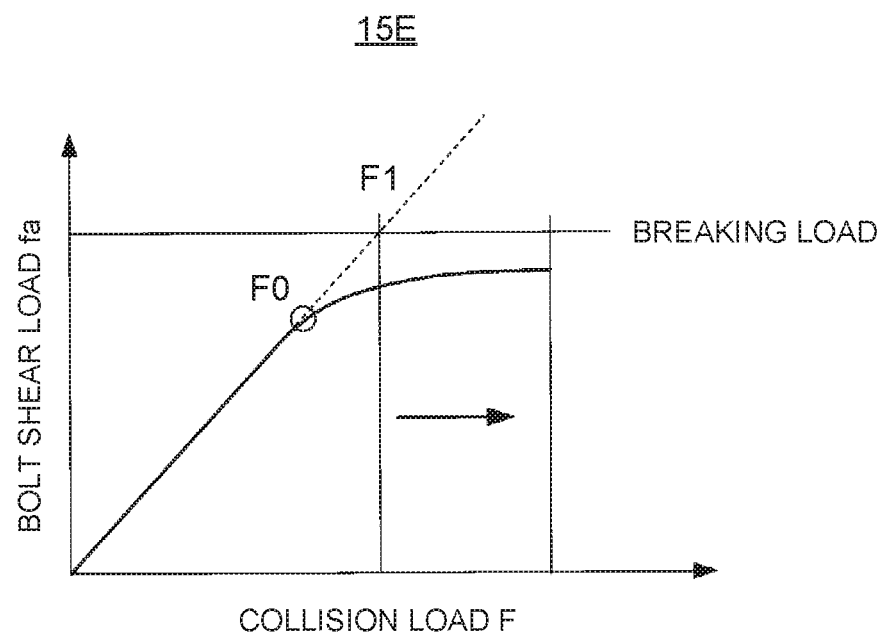
FIG. 6A is a graph showing how a shear load input into a bolt at a specific fastening part changes as the collision load changes.
Figure 6B:
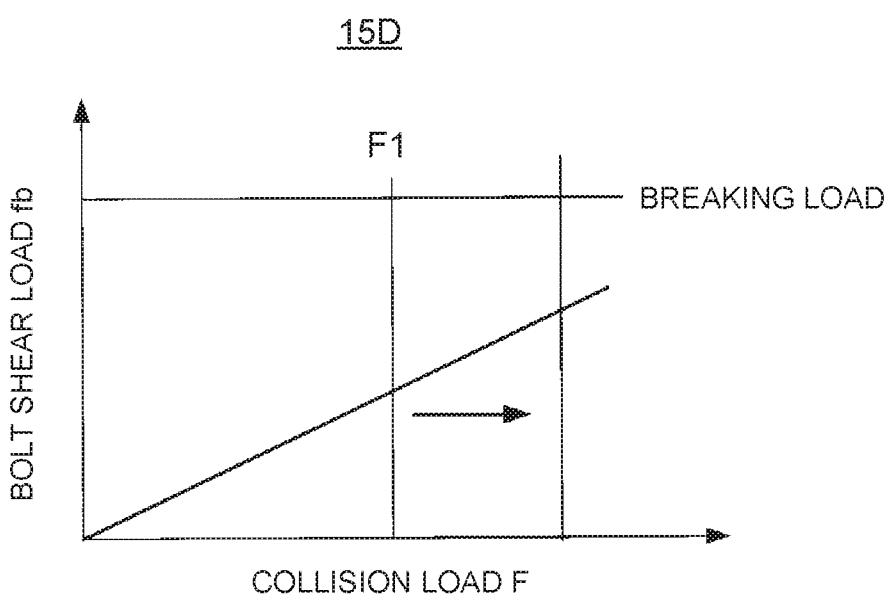
FIG. 6B is a graph showing how a shear load input into a bolt at an ordinary fastening part changes as the collision load changes.

For example, a shear load input into the bolt 9 at the fastening part 15E provided on the side surface 2a that is located on an extension of the collision load F, and a shear load input into the bolt 9 at the fastening part 15D provided on the corner 2b on the opposite side from the input position of the collision load F, as shown in FIG. 5, will be compared. FIG. 6A shows how the shear load input into the bolt 9 at the fastening part 15E changes as the collision load F changes. FIG. 6B shows how the shear load input into the bolt 9 at the fastening part 15D changes as the collision load F changes. When FIG. 6A and FIG. 6B are compared, a bolt shear load fa on the fastening part 15E and a bolt shear load fb on the fastening part 15D are both proportional to the collision load F in an elastic range, but within the elastic range, the rate of change in the bolt shear load fa on the fastening part 15E is higher than the rate of change in the bolt shear load fb on the fastening part 15D. Changes in bolt shear load on the other fastening parts 15A to 15C, 15F, 15G, which are not shown, are slower than the changes in bolt shear load on the fastening part 15D shown in FIG. 6B. Thus, a shear load concentrates on the fastening part 15E when the collision load F is input into the casing 2 as shown in the drawings. In this embodiment, therefore, the fastening part 15E corresponds to an example of the specific fastening part according to the above-described aspect, and at least one of the fastening parts 15A to 15D, 15F, 15G other than the fastening part 15E corresponds to an example of the ordinary fastening part according to the above-described aspect.

Figure 7A:
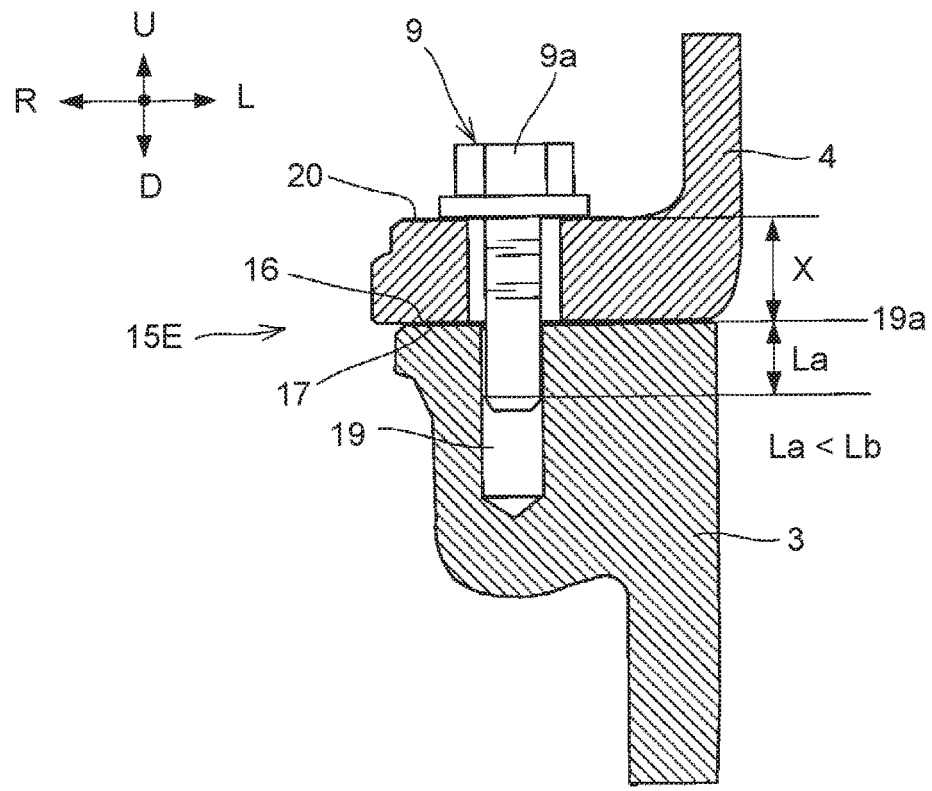
FIG. 7A is a sectional view of the specific fastening part according to a first embodiment.
Figure 7B:
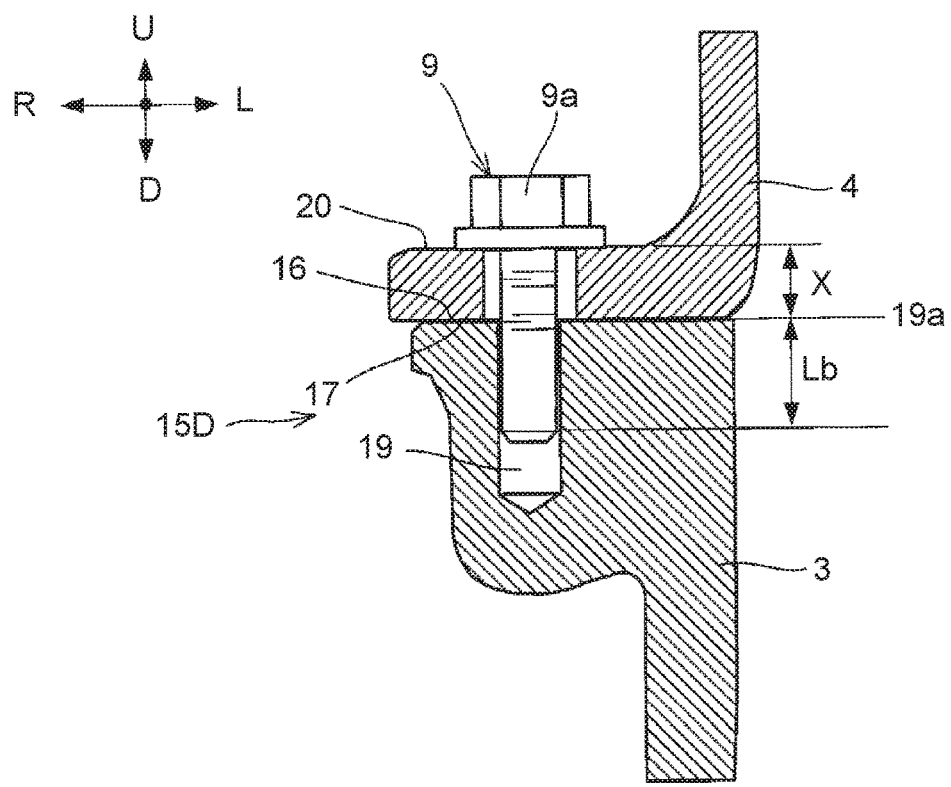
FIG. 7B is a sectional view of the ordinary fastening part according to the first embodiment.

FIG. 7A shows a section of the fastening part 15E, and FIG. 7B shows a section of the fastening part 15D. As sections of the fastening parts 15A to 15C, 15F, 15G are substantially the same as the section of the fastening part 15D shown in FIG. 7B, description of these sections will be omitted. When FIG. 7A and FIG. 7B are compared, an engagement allowance of the bolt La that is a length of meshing between the bolt 9 and the internal thread 19 in the fastening part 15E shown in FIG. 7A is set to be shorter than an engagement allowance of the bolt Lb in the fastening part 15D shown in FIG. 7B. In the case of this embodiment, the fastening part 15E is formed such that a distance X from a bolt seating surface 20 on which a head 9a of the bolt 9 is seated to a position 19a at which the internal thread 19 starts to mesh in the fastening part 15E is longer than that in the fastening part 15D. The engagement allowance of the bolt La of the fastening part 15E is thereby set to be shorter than the engagement allowance of the bolt Lb of the fastening part 15D.

In other words, the fastening part 15E is formed such that the plate thickness of the fastening part 15E on the side of the inverter case 4 is larger than the plate thickness of the fastening part 15D on the side of the inverter case 4, and thereby the engagement allowance of the bolt La of the fastening part 15E is set to be shorter than the engagement allowance of the bolt Lb of the fastening part 15D. In yet other words, the fastening part 15E is formed such that, when the position of the fastening surfaces 16, 17 is used as reference, the level of the bolt seating surface 20 of the fastening part 15E is higher than the level of the bolt seating surface 20 of the fastening part 15D, and thereby the engagement allowance of the bolt La of the fastening part 15E is set to be shorter than the engagement allowance of the bolt Lb of the fastening part 15D.

Thus, when the collision load F is input into the casing 2 as shown in the drawings, the fastening part 15E undergoes, before the bolt 9 fractures, plastic deformation in such a form that an inner circumference of the internal thread 19 expands, earlier than the other fastening parts 15D etc. The shorter the engagement allowance of the bolt, the narrower the range in which a load acts on the internal thread 19, and therefore the more likely it is that plastic deformation involving expansion of the inner circumference of the internal thread 19 occurs. In other words, the shorter the engagement allowance of the bolt, the lower the elastic limit of the fastening part. Therefore, the fastening part 15E having the engagement allowance of the bolt La shorter than the engagement allowance of the bolt Lb of the other fastening parts 15D etc. corresponds to an example of the specific fastening part provided with the induction portion according to the above-described aspect.

Effects of First Embodiment

The dashed part of the curve of the bolt shear load shown in FIG. 6A represents a case of a comparative example in which the engagement allowance of the bolt La of the fastening part 15E and the engagement allowance of the bolt Lb of the other fastening parts 15D etc. are set to be equal. In the case of the comparative example, the bolt 9 at the fastening part 15E fractures by reaching the breaking load before the bolt 9 at the fastening part 15D shown in FIG. 6B reaches the breaking load. Accordingly, the load-carrying capacity in the case of the comparative example is µl. By contrast, the fastening part 15E of the embodiment undergoes plastic deformation of the internal thread 19 at a load F0 before the bolt 9 reaches the shear breaking load, earlier than the other fastening parts 15D etc. Thus, the ratio of the shear load borne by the bolt 9 at the fastening part 15E is reduced. The shear load corresponding to this reduction is dispersed to the other fastening parts 15D etc., while fracture of the bolt 9 at the fastening part 15E on which the shear load concentrates is avoided. As a result, the load-carrying capacity of the casing 2 is increased from µl as indicated by the arrow.

In the first embodiment, the engagement allowance of the bolt can be differentiated among the fastening parts 15 while the same bolts 9 are used for the fastening parts 15, which allows easy assembly and parts management.

Second Embodiment

A second embodiment relates to a mounting structure of the PCU 1 shown in FIG. 1. As described above, the fastening parts 50f, 50r against which the brackets BKf, BKr are pressed and in that state fastened with the bolts B2 to mount the casing 2 of the PCU 1, are provided on the upper part of the transaxle TA. It is known that, when the collision load F is input into the casing 2 as shown in the drawings during a frontal collision of the vehicle, a shear load concentrates on the fastening part 50r provided in the vehicle rear-side bracket BKr. In the second embodiment, therefore, the fastening part 50r provided in the vehicle rear-side bracket BKr corresponds to an example of the specific fastening part according to the above-described aspect, and the fastening part 50f provided in the vehicle front-side bracket BKf corresponds to an example of the ordinary fastening part according to the above-described aspect.

Figure 8A:
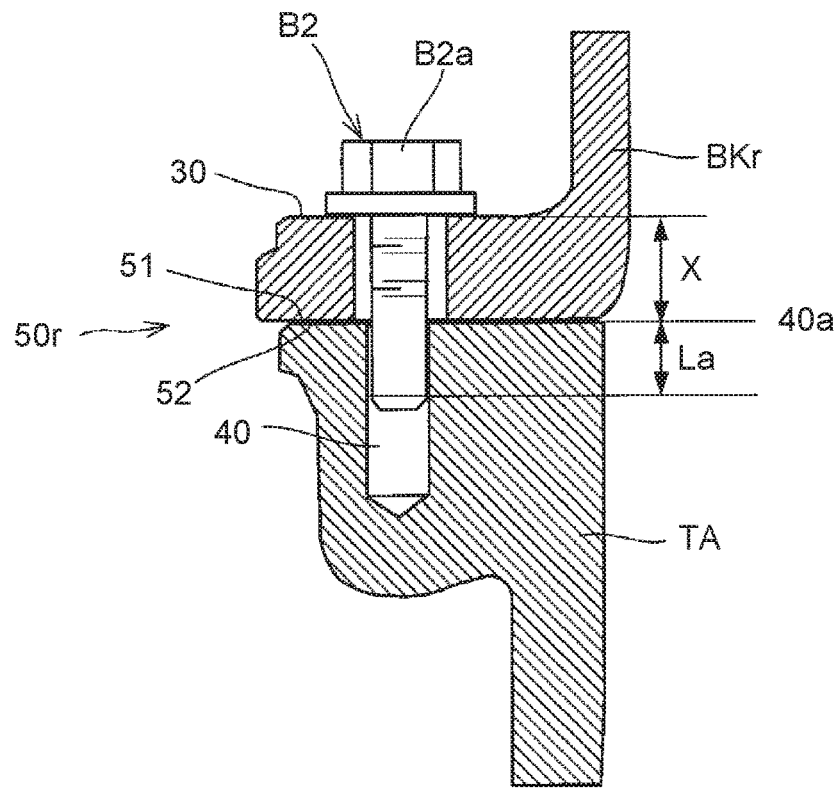
FIG. 8A is a sectional view of a specific fastening part according to a second embodiment.
Figure 8B:
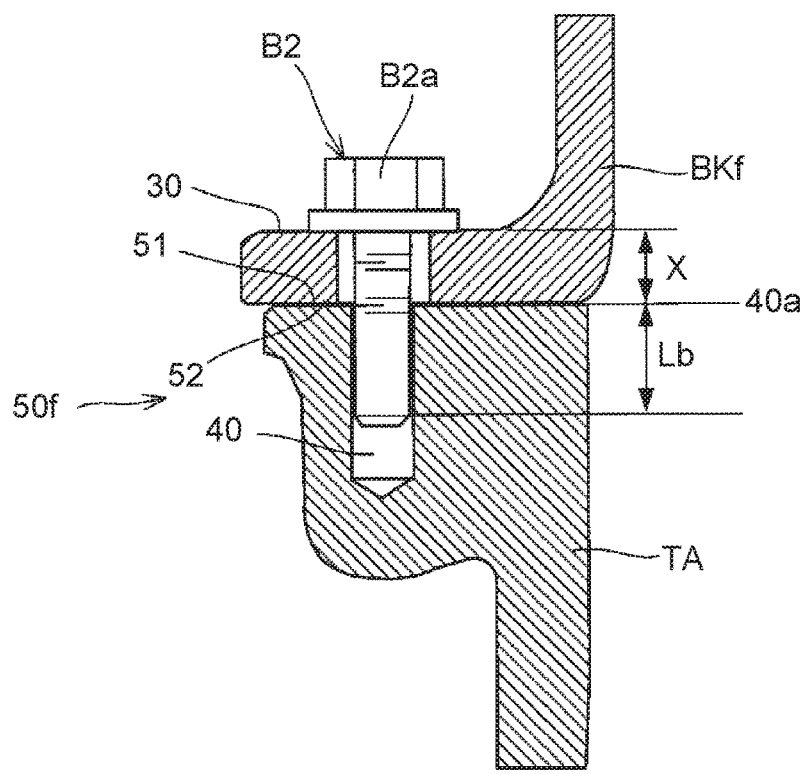
FIG. 8B is a sectional view of an ordinary fastening part according to the second embodiment.

In the second embodiment, as in the first embodiment, an engagement allowance of the bolt B2 provided at the vehicle rear-side fastening part 50r is set to be shorter than an engagement allowance of the bolt B2 provided at the vehicle front-side fastening part 50f such that the vehicle rear-side fastening part 50r on which a shear load concentrates undergoes plastic deformation earlier than the vehicle front-side fastening part 50f. Sections of the vehicle rear-side fastening part 50r and the vehicle front-side fastening part 50f are substantially the same as the sections shown in FIG. 7A and FIG. 7B. Specifically, as shown in FIG. 8A and FIG. 8B, the vehicle rear-side fastening part 50r is formed such that a distance X from a bolt seating surface 30 on which a head B2a of the bolt B2 is seated to a position 40a at which the internal thread 40 formed in the transaxle TA starts to mesh in the vehicle rear-side fastening part 50r is longer than that in the vehicle front-side fastening part 50f. An engagement allowance of the bolt La of the vehicle rear-side fastening part 50r is thereby set to be shorter than an engagement allowance of the bolt Lb of the fastening part 50f.

In other words, the fastening part 50r is formed such that the plate thickness of the fastening part 50r on the side of the bracket BKr is larger than the plate thickness of the fastening part 50f on the side of the bracket BKf, and thereby the engagement allowance of the bolt La of the fastening part 50r is set to be shorter than the engagement allowance of the bolt Lb of the fastening part 50f. In yet other words, the fastening parts 50f, 50r are formed such that, when the position of fastening surfaces 51, 52 thereof is used as reference, the level of the bolt seating surface 30 of the fastening part 50r is higher than the level of the bolt seating surface 30 of the fastening part 50f, and thereby the engagement allowance of the bolt La of the fastening part 50r is set to be shorter than the engagement allowance of the bolt Lb of the fastening part 50f. In the second embodiment, the vehicle rear-side fastening part 50r having the engagement allowance of the bolt La shorter than the engagement allowance of the bolt Lb of the vehicle front-side fastening part 50f corresponds to an example of the specific fastening part provided with the induction portion according to the above-described aspect.

Effects of Second Embodiment

The mounting structure of the second embodiment causes the vehicle rear-side fastening part 50r to undergo plastic deformation before the bolt B2 reaches the breaking load, earlier than the vehicle front-side fastening part 50f. Thus, the ratio of the shear load borne by the vehicle rear-side fastening part 50r is reduced. The shear load corresponding to this reduction due to plastic deformation is dispersed to the vehicle front-side fastening part 50f, while fracture of the bolt B2 at the vehicle rear-side fastening part 50r on which the shear load concentrates is avoided. Thus, the load-carrying capacity of the mounting structure of the PCU 1 can be increased.

Modified Example

Figure 9:
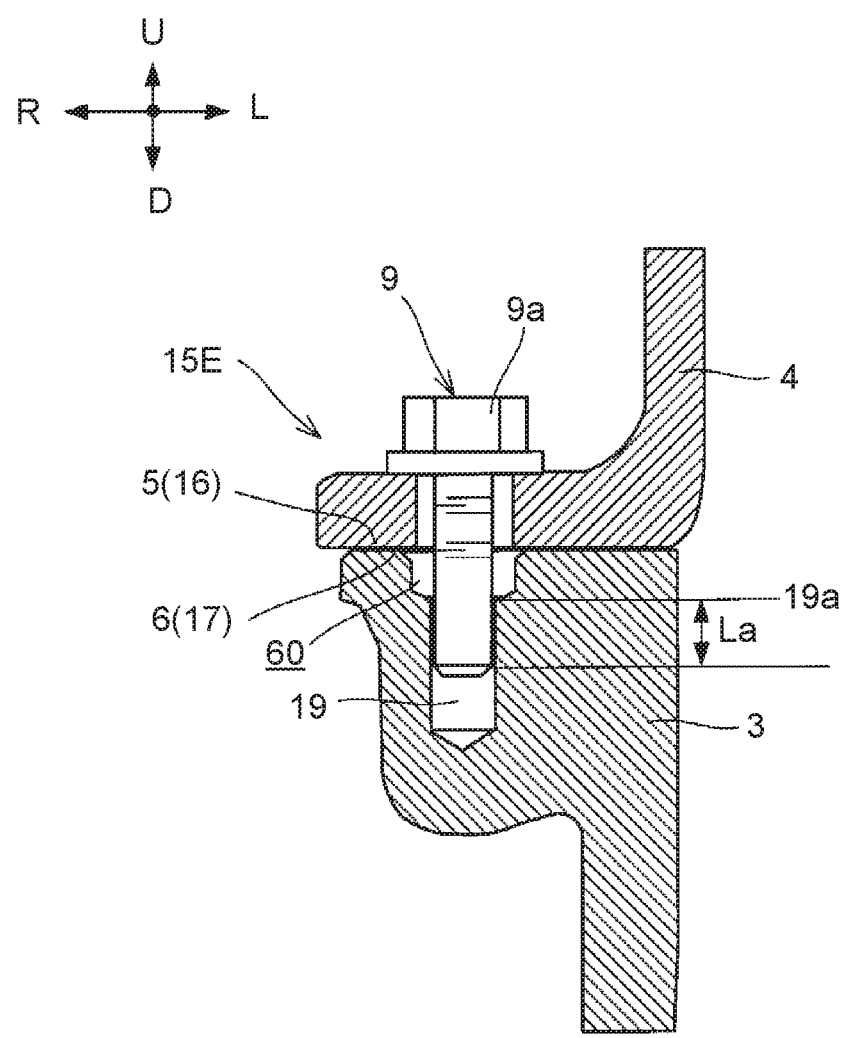
FIG. 9 is a sectional view showing the configuration of a modified example of the specific fastening part.

Next, a modified example will be described with reference to FIG. 9. As shown in FIG. 9, in the modified example, to reduce the engagement allowance of the bolt of the fastening part 15E on which a shear load concentrates, a hollow is formed around the internal thread 19 within a range from the joint surfaces 5, 6 of the converter case 3 and the inverter case 4 to the position 19a at which the internal thread 19 starts to mesh, and a space 60 is made so that the bolt and the casing segment are not in contact with each other. When such the space 60 is made, the meshing start position 19a is moved farther away from the joint surfaces 5, 6. Thus, it is possible to make the engagement allowance of the bolt La of the fastening part 15E on which a shear load concentrates shorter than that of the other fastening parts, without changing the plate thickness on the side of the inverter case 4. Moreover, when such a hollow is formed, the bolt 9 is freed from restraint in the range from the joint surfaces 5, 6 to the meshing start position 19a, so that the bolt 9 at the fastening part 15E can bend easily. Thus, this hollow has an effect of partially relieving the load borne by the bolt 9 through bending deformation. In this case, therefore, the fastening part 15E undergoes plastic deformation in such a form that the bolt 9 bends and the inner circumference of the internal thread 19 expands. In the modified example, the fastening part 15E with the hollow formed around the internal thread 19 corresponds to an example of the specific fastening part provided with the induction portion according to the above-described aspect. Also in the second embodiment, a hollow may be formed around the internal thread 40 within a range from the joint surfaces of the bracket BKr and the transaxle TA to the position 40a at which the internal thread 40 starts to mesh.

As different from that of the above embodiments and modified example, for example, an intervening member, such as a washer or a collar, can be interposed between the bolt 9 or the bolt B2 and the bolt seating surface at the fastening part on which a shear load concentrates, to thereby make the engagement allowance of the bolt of that fastening part shorter than the engagement allowance of the bolt of each of the other fastening parts. The fastening part having the intervening member interposed between the bolt and the bolt seating surface corresponds to an example of the specific fastening part provided with the induction portion according to the above-described aspect. Alternatively, to reduce the engagement allowance of the bolt, the length of the bolt used for the fastening part on which a shear load concentrates can be made shorter than the length of the bolts used for the other fastening parts. The fastening part for which the short bolt is used corresponds to an example of the specific fastening part provided with the induction portion according to the above-described aspect.

To cause the fastening part on which a shear load concentrates to undergo plastic deformation earlier than the other fastening parts, it is also possible to lower the elastic limit of the fastening part on which a shear load concentrates, by making the bolt at that specific fastening part thinner than the bolts at the other fastening parts while setting the engagement allowance of the bolt of each of the fastening parts to be equal. Thus, the fastening part on which a shear load concentrates undergoes, earlier than the other fastening parts, plastic deformation in such a form that the thin bolt bends and the inner circumference of the internal thread expands. The modified example has an advantage in that the need for special processing etc. to be performed on the specific fastening part to reduce the engagement allowance of the bolt can be eliminated. The fastening part for which the thin bolt is used corresponds to an example of the specific fastening part provided with the induction portion according to the above-described aspect. It is also possible to form induction portion by combining the use of a thin bolt for the specific fastening part and the reduction of the engagement allowance of the bolt thereof.

The number of the fastening parts is not limited. For example, the above embodiments can be changed into an embodiment in which the vehicle front-side fastening part 15G is omitted and the casing 2 is fastened at the six fastening parts 15A to 15F. The above embodiments can also be changed into an embodiment in which the fastening parts include the fastening parts 15A to 15F and further include two or more additional fastening parts.

Assuming a frontal collision as descried above is merely an example. When the input position and direction of a collision load into the PCU 1 change, the fastening part on which a shear load concentrates can change. Therefore, the specific fastening part and the ordinary fastening part are specified according to an assumed collision direction and the arrangement of the PCU 1. The induction portion according to the above embodiments and modified examples can be provided in the specific fastening part thus specified.

The engine compartment EC disposed on the vehicle front side is an example of the driving unit housing chamber. The driving unit housing chamber may be another closed space in a vehicle, for example, an engine compartment disposed on the vehicle rear side or in the middle of the vehicle, or a front compartment or a rear compartment housing an electric motor etc. of an electric vehicle.

The power converter PD functions as an inverter and a converter, but may instead be a power converter that functions, for example, only as an inverter or a converter.

The casing 2 is formed by combining the inverter case 4 and the converter case 3 and closing the openings of the cases by the lower cover 10 and the upper cover 11. However, this form is merely an example. For example, the casing 2 may be a casing formed by combining two casing segments, each having one opening, so as to butt together the open sides of the casing segments. Alternatively, the casing 2 may be a casing formed by combining a casing segment that has one opening and a cover that is the other casing segment and covers the opening.

Aspects of the present disclosure derived from the above embodiments and modified examples will be described below.

A power control unit according to an aspect of the present disclosure is a power control unit (1) that includes a casing (2) housing a power converter (PD) and is disposed inside a driving unit housing chamber (EC) of a vehicle. In this power control unit, the casing is formed by combining a plurality of casing segments (3, 4), and the casing segments are fastened together with bolts (9) at a plurality of fastening parts (15A to 15G) provided around the casing segments. The fastening parts include a specific fastening part (15E) on which a shear load concentrates when a load (F) is input into the casing, and an ordinary fastening part (15A to 15D, 15F, 15G) that is a fastening part other than the specific fastening part. The specific fastening part is provided with an induction portion inducing plastic deformation, the induction portion lowers an elastic limit of the specific fastening part such that, when the load is input into the casing, the specific fastening part undergoes plastic deformation earlier than the ordinary fastening part. While the reference signs according to the above embodiments are indicated in parentheses, this is not intended to limit the components to those described in the above embodiments.

In the power control unit of this aspect, the specific fastening part on which a shear load concentrates when a load is input into the casing is provided with the induction portion that lowers the elastic limit of the specific fastening part such that the specific fastening part undergoes elastic deformation earlier than the ordinary fastening part. Thus, when a load is input into the casing, the specific fastening part undergoes plastic deformation earlier than the ordinary fastening part, and thereby the ratio of the shear load borne by the bolt at the specific fastening part is reduced. As the shear load corresponding to this reduction of the shear load on the specific fastening part is dispersed to the ordinary fastening part, the load-carrying capacity of the casing is increased. Examples of the forms of plastic deformation of the specific fastening part include a form in which the inner circumference of the internal thread that meshes with the bolt expands, and a form in which the bolt bends and the inner circumference of the internal thread expands.

In the above aspect, each of the fastening parts may have a bolt insertion hole (18) through which the bolt is inserted, and an internal thread (19) that meshes with the bolt inserted through the bolt insertion hole. An engagement allowance of the bolt (La, Lb) that is a length of meshing between the bolt and the internal thread may be set for each of the fastening parts. The induction portion may be formed by setting the engagement allowance of the bolt (La) of the specific fastening part to be shorter than the engagement allowance of the bolt (Lb) of the ordinary fastening part. The shorter the engagement allowance of the bolt, the narrower the range in which a load acts on the internal thread, and therefore the more likely it is that plastic deformation of the form involving expansion of the inner circumference of the internal thread occurs and that the elastic limit of the specific fastening part lowers. Thus, the specific fastening part can be caused to undergo plastic deformation earlier than the ordinary fastening part.

There are various forms for reducing the engagement allowance of the bolt. For example, each of the fastening parts may be provided with a bolt seating surface (20) on which a head (9a) of the bolt is seated, and the engagement allowance of the bolt of the specific fastening part may be set by forming the specific fastening part such that a distance (X) from the bolt seating surface to a position (19a) at which the internal thread starts to mesh in the specific fastening part is longer than that in the ordinary fastening part. In this case, the engagement allowance of the bolt can be differentiated among the fastening parts while the same bolts are used for the fastening parts, which has the advantage of allowing easy assembly and parts management.

In the above aspect, the induction portion may be formed by using, as the bolt provided at the specific fastening part, a bolt thinner than the bolt provided at the ordinary fastening part. In this case, there is an advantage in that the need for special processing etc. to be performed on the specific fastening part to reduce the engagement allowance of the bolt can be eliminated.

In the above aspect, each of the fastening parts may have a bolt insertion hole (18) through which the bolt is inserted, and an internal thread (19) that meshes with the bolt inserted through the bolt insertion hole. The induction portion may be formed by providing a hollow around the internal thread within a range from joint surfaces (5, 6) of the casing segments to the position (19a) at which the internal thread starts to mesh. With the hollow thus formed, the position at which the internal thread starts to mesh is moved farther away from the joint surfaces, and thereby the engagement allowance of the bolt of the specific fastening part can be made shorter than that of the ordinary fastening part. Moreover, with the hollow thus formed, the bolt is freed from restraint in the range from the joint surfaces to the meshing start position, so that the bolt at the specific fastening part can bend easily. Thus, the hollow has an effect of partially relieving the load borne by the bolt through bending deformation. As a result, the fastening part on which a shear load concentrates undergoes plastic deformation in such a form that the bolt bends and the inner circumference of the internal thread expands.

A power control unit mounting structure according to an aspect of the present disclosure is a mounting structure of a power control unit (1) that includes a casing (2) housing a power converter (PD) and is disposed inside a driving unit housing chamber (EC) of a vehicle. In this mounting structure, the casing is mounted by being fastened with bolts (B2) at a plurality of fastening parts (50f, 50r) to a predetermined member (TA) provided in the driving unit housing chamber. The fastening parts include a specific fastening part (50r) on which a shear load concentrates when a load (F) is input into the casing, and an ordinary fastening part (50f) that is a fastening part other than the specific fastening part. The specific fastening part is provided with an induction portion inducing plastic deformation, the induction portion lowers an elastic limit of the specific fastening part such that, when the load is input into the casing, the specific fastening part undergoes plastic deformation earlier than the ordinary fastening part. While the reference signs according to the above embodiments are indicated in parentheses, this is not intended to limit the components to those described in the above embodiments.

In the power control unit mounting structure of this aspect, the specific fastening part on which a shear load concentrates when a load is input into the casing is provided with the induction portion that lowers the elastic limit of the specific fastening part such that the specific fastening part undergoes plastic deformation earlier than the ordinary fastening part. Thus, when a load is input into the casing, the specific fastening part undergoes plastic deformation earlier than the ordinary fastening part, and thereby the ratio of the shear load borne by the bolt at the specific fastening part is reduced. As the shear load corresponding to this reduction of the shear load on the specific fastening part is dispersed to the ordinary fastening part, the load-carrying capacity of the mounting structure is increased.

In the above aspect, each of the fastening parts may have a bolt insertion hole (Bh) through which the bolt is inserted, and an internal thread (40) that meshes with the bolt inserted through the bolt insertion hole. An engagement allowance of the bolt (La, Lb) that is a length of meshing between the bolt and the internal thread may be set for each of the fastening parts. The induction portion may be formed by setting the engagement allowance of the bolt (La) of the specific fastening part to be shorter than the engagement allowance of the bolt (Lb) of the ordinary fastening part. The shorter the engagement allowance of the bolt, the narrower the range in which a load acts on the internal thread, and therefore the more likely it is that plastic deformation of the form involving expansion of the inner circumference of the internal thread occurs and that the elastic limit of the specific fastening part lowers. Thus, the specific fastening part can be caused to undergo plastic deformation earlier than the ordinary fastening part.

There are various forms for reducing the engagement allowance of the bolt. For example, each of the fastening parts may be provided with a bolt seating surface (30) on which a head (B2a) of the bolt is seated, and the engagement allowance of the bolt of the specific fastening part may be set by forming the specific fastening part such that a distance (X) from the bolt seating surface to a position (40a) at which the internal thread starts to mesh in the specific fastening part is longer than that in the ordinary fastening part. In this case, the engagement allowance of the bolt can be differentiated among the fastening parts while the same bolts are used for the fastening parts, which has the advantage of allowing easy assembly and parts management.

A power control unit according to an aspect of the present disclosure is a power control unit (1) that includes a casing (2) housing a power converter (PD) and is disposed inside a driving unit housing chamber (EC) of a vehicle. In this power control unit, the casing is formed by combining a plurality of casing segments (3, 4), and the casing segments are fastened together with bolts (9) at a plurality of fastening parts (15A to 15G) provided around the casing segments. The fastening parts include a specific fastening part (15E) on which a shear load concentrates when a load (F) is input into the casing, and an ordinary fastening part (15A to 15D, 15F, 15G) that is a fastening part other than the specific fastening part. An elastic limit of the specific fastening part is lower than an elastic limit of the ordinary fastening part, such that the specific fastening part undergoes plastic deformation earlier than the ordinary fastening part when the load is input into the casing. While the reference signs according to the above embodiments are indicated in parentheses, this is not intended to limit the components to those described in the above embodiments.

In the power control unit of this aspect, the elastic limit of the specific fastening part on which a shear load concentrates is lower than the elastic limit of the ordinary fastening part. Thus, when a load is input into the casing, the specific fastening part undergoes plastic deformation earlier than the ordinary fastening part, and thereby the ratio of the shear load borne by the bolt at the specific fastening part is reduced. As the shear load corresponding to this reduction of the shear load on the specific fastening part is dispersed to the ordinary fastening part, the load-carrying capacity of the casing is increased. Examples of the forms of plastic deformation of the specific fastening part include a form in which the inner circumference of the internal thread that meshes with the bolt expands, and a form in which the bolt bends and the inner circumference of the internal thread expands.

What is claimed is:

1. A power control unit located inside a housing chamber of a driving unit of a vehicle, the power control unit comprising a casing housing a power conversion device, wherein:
    the casing includes a plurality of casing segments;
    a plurality of fastening parts are located around the plurality of casing segments;
    the plurality of casing segments are fastened to each other with bolts at the plurality of fastening parts;
    the plurality of fastening parts include a specific fastening part on which a shear load concentrates when a load is input into the casing, and an ordinary fastening part other than the specific fastening part;
    the specific fastening part has an induction portion inducing plastic deformation; and the induction portion is configured to lower an elastic limit of the specific fastening part when the load is input into the casing, such that the specific fastening part undergoes plastic deformation earlier than the ordinary fastening part.

2. The power control unit according to claim 1, wherein:
    each of the plurality of fastening parts has a bolt insertion hole and an internal thread;
    a bolt among the bolts is inserted through the bolt insertion hole;
    the internal thread meshes with the bolt inserted through the bolt insertion hole;
    in the specific fastening part, a part that the bolt and the internal thread mesh with each other is a first engagement allowance of the bolt;
    in the ordinary fastening part, a part that the bolt and the internal thread mesh with each other is a second engagement allowance of the bolt; and
    in the induction portion, a length of the first engagement allowance of the bolt is shorter than a length of the second engagement allowance of the bolt.

3. The power control unit according to claim 2, wherein:
    each of the plurality of fastening parts has a bolt seating surface on which a head of the bolt is seated;
    in the specific fastening part, a distance from the bolt seating surface to a position at which the internal thread and the bolt inserted through the bolt insertion hole start to mesh with each other is a first insertion distance;
    in the ordinary fastening part, a distance from the bolt seating surface to a position at which the internal thread and the bolt inserted through the bolt insertion hole start to mesh with each other is a second insertion distance; and
    in the induction portion, the first insertion distance is longer than the second insertion distance.

4. The power control unit according to claim 1, wherein the induction portion has a bolt thinner than a bolt of the ordinary fastening part.

5. The power control unit according to claim 1, wherein:
    each of the plurality of fastening parts has a bolt insertion hole and an internal thread;
    a bolt among the bolts is inserted through the bolt insertion hole;
    the internal thread meshes with the bolt inserted through the bolt insertion hole; and
    in a range from a joint surface of the plurality of casing segments to a position at which the internal thread and the bolt inserted through the bolt insertion hole start to mesh with each other in the specific fastening part, the inducing portion has such a space that the bolt and the casing segment are not in contact with each other.

6. A mounting structure of a power control unit, the power control unit being equipped with a casing housing a power converter, the casing being disposed inside a housing chamber of a driving unit of a vehicle, wherein:
    the casing is fastened with bolts at a plurality of fastening parts to a predetermined member provided in the housing chamber of the driving unit;
    the plurality of fastening parts include a specific fastening part on which a shear load concentrates when a load is input into the casing, and an ordinary fastening part other than the specific fastening part;
    the specific fastening part has an induction portion inducing plastic deformation; and
    the induction portion is configured to lower an elastic limit of the specific fastening part when the load is input into the casing, such that the specific fastening part undergoes plastic deformation earlier than the ordinary fastening part.

7. The mounting structure of the power control unit according to claim 6, wherein:
    each of the plurality of fastening parts has a bolt insertion hole and an internal thread;
    a bolt among the bolts is inserted through the bolt insertion hole;
    the internal thread meshes with the bolt inserted through the bolt insertion hole;
    in the specific fastening part, a part that the bolt and the internal thread mesh with each other is a first engagement allowance of the bolt;
    in the ordinary fastening part, a part that the bolt and the internal thread mesh with each other is a second engagement allowance of the bolt; and
    in the induction portion, a length of the first engagement allowance of the bolt is shorter than a length of the second engagement allowance of the bolt.

8. The mounting structure of the power control unit according to claim 7, wherein:
    each of the plurality of fastening parts has a bolt seating surface on which a head of the bolt is seated;
    in the specific fastening part, a distance from the bolt seating surface to a position at which the internal thread and the bolt inserted through the bolt insertion hole start to mesh with each other is a first insertion distance;
    in the ordinary fastening part, a distance from the bolt seating surface to a position at which the internal thread and the bolt inserted through the bolt insertion hole start to mesh with each other is a second insertion distance; and in the induction portion, the first insertion distance is longer than the second insertion distance.

9. A power control unit located inside a housing chamber of a driving unit of a vehicle, the power control unit comprising a casing housing a power conversion device, wherein:

the casing includes a plurality of casing segments;

a plurality of fastening parts are located around the plurality of casing segments;

the plurality of casing segments are fastened to each other with bolts at the plurality of fastening parts;

the plurality of fastening parts include a specific fastening part on which a shear load concentrates when a load is input into the casing, and an ordinary fastening part other than the specific fastening part;

the specific fastening part has an induction portion inducing plastic deformation; and an elastic limit of the specific fastening part is lower than an elastic limit of the ordinary fastening part, such that the specific fastening part undergoes plastic deformation earlier than the ordinary fastening part when the load is input into the casing.

* * * * *

UNITED STATES PATENT AND TRADEMARK OFFICE
CERTIFICATE OF CORRECTION

PATENT NO.       : 10,897,830 B2
APPLICATION NO.  : 16/296745
DATED            : January 19, 2021
INVENTOR(S)      : Kenjiro Shiba, Keisuke Yuki and Takuya Yashiki Page 1 of 1

It is certified that error appears in the above-identified patent and that said Letters Patent is hereby corrected as shown below:

In the Specification

In Column 7, Line(s) 16, delete "$\mu 1$" and insert --F1--, therefor.

In Column 7, Line(s) 26, delete "$\mu 1$" and insert --F1--, therefor.

Signed and Sealed this
Twentieth Day of April, 2021

Drew Hirshfeld
*Performing the Functions and Duties of the*
*Under Secretary of Commerce for Intellectual Property and*
*Director of the United States Patent and Trademark Office*